(12) United States Patent
Lee

(10) Patent No.: US 9,681,082 B2
(45) Date of Patent: Jun. 13, 2017

(54) ANALOG-TO-DIGITAL CONVERTER CONFIGURED TO OPERATE AT HIGH SPEED AND IMAGE SENSOR INCLUDING THE SAME

(71) Applicant: Samsung Electronics Co., Ltd., Suwon-Si, Gyeonggi-Do (KR)

(72) Inventor: Hyeok-Jong Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 293 days.

(21) Appl. No.: 14/521,821

(22) Filed: Oct. 23, 2014

(65) Prior Publication Data

US 2015/0181145 A1    Jun. 25, 2015

(30) Foreign Application Priority Data

Dec. 24, 2013    (KR) .................. 10-2013-0162838

(51) Int. Cl.

| | |
|---|---|
| H04N 5/378 | (2011.01) |
| H03L 7/08 | (2006.01) |
| H03M 1/34 | (2006.01) |
| H04N 5/376 | (2011.01) |
| H04N 5/3745 | (2011.01) |
| H03M 1/12 | (2006.01) |
| H03M 1/56 | (2006.01) |

(52) U.S. Cl.
CPC ........... *H04N 5/378* (2013.01); *H04N 5/3745* (2013.01); *H04N 5/3765* (2013.01); *H03M 1/123* (2013.01); *H03M 1/56* (2013.01)

(58) Field of Classification Search
CPC .. H04N 5/378; H04N 5/3745; H04N 5/37455; H04N 5/3765; H04N 5/3355; H04N 5/376; H03M 1/34; H03M 1/56; H03M 1/123; H03L 7/08
See application file for complete search history.

(56) References Cited

U.S. PATENT DOCUMENTS

| | | | |
|---|---|---|---|
| 5,132,633 A | 7/1992 | Wong et al. | |
| 7,379,011 B2 * | 5/2008 | Ham | H03M 1/58 341/128 |
| 7,859,583 B2 | 12/2010 | Kawaguchi | |
| 8,023,002 B2 * | 9/2011 | Kinoshita | H04N 5/23245 348/207.1 |
| 8,264,580 B2 * | 9/2012 | Mori | H04N 3/155 348/248 |
| 8,432,149 B2 | 4/2013 | Levine | |
| 8,547,461 B2 * | 10/2013 | Jung | H04N 5/3575 341/155 |

(Continued)

OTHER PUBLICATIONS

Takayuki Toyama et al., "A 17.7Mpixel 120fps CMOS Image Sensor with 34.8Gb/s Readout;" State Ciruits Conference Digest of Technical Papers (ISSCC), Feb. 20-24, 2011 IEEE International.

*Primary Examiner* — John Lee
(74) *Attorney, Agent, or Firm* — Harness, Dickey & Pierce, P.L.C.

(57) ABSTRACT

Provided is an image sensor including a pixel array including a plurality of pixels and an analog-to-digital converter (ADC) configured to compare a reference voltage with an analog voltage output by the pixel array and latch and decode a comparison result. The ADC is controlled in response to clock information and a counter clock, which are obtained by expanding and encoding a master clock.

15 Claims, 7 Drawing Sheets

(56) References Cited

U.S. PATENT DOCUMENTS

| | | | | |
|---|---|---|---|---|
| 8,749,420 B2* | 6/2014 | Takahashi | ............. | H03M 1/007 341/131 |
| 8,941,045 B2* | 1/2015 | Okura | ................... | H03M 1/00 250/208.1 |
| 9,380,246 B2* | 6/2016 | Lee | ...................... | H04N 5/378 |
| 2002/0126215 A1* | 9/2002 | Shigematsu | ............ | H04N 5/355 348/302 |
| 2005/0259058 A1* | 11/2005 | Yamaguchi | ............ | G09G 3/3688 345/87 |
| 2007/0046513 A1* | 3/2007 | Ham | ........................ | H03M 1/58 341/118 |
| 2007/0046802 A1* | 3/2007 | Ham | ........................ | H04N 5/3575 348/308 |
| 2008/0239124 A1* | 10/2008 | Mori | ....................... | H04N 3/155 348/308 |
| 2009/0040352 A1* | 2/2009 | Kawaguchi | ............ | G06F 3/044 348/308 |
| 2009/0219240 A1* | 9/2009 | Yamaguchi | ........... | G09G 3/3688 345/88 |
| 2010/0271519 A1* | 10/2010 | Ui | ........................... | H03M 1/14 348/302 |
| 2010/0271525 A1* | 10/2010 | Takahashi | ............... | H03M 1/14 348/308 |
| 2011/0141081 A1* | 6/2011 | Shigematsu | ........... | H04N 5/355 345/208 |
| 2012/0038809 A1 | 2/2012 | Lee et al. | | |
| 2012/0098990 A1* | 4/2012 | Jung | ..................... | H04N 5/3575 348/222.1 |
| 2012/0229319 A1* | 9/2012 | Takahashi | ............... | H03M 1/007 341/155 |
| 2013/0015329 A1 | 1/2013 | Iwaki | | |
| 2013/0278451 A1* | 10/2013 | Kim | ..................... | H03K 23/005 341/98 |
| 2013/0284888 A1* | 10/2013 | Okura | ..................... | H03M 1/00 250/208.1 |
| 2014/0098272 A1* | 4/2014 | Nakamura | ......... | H04N 5/37455 348/308 |
| 2015/0138408 A1* | 5/2015 | Lee | ........................ | H04N 5/378 348/294 |
| 2015/0162925 A1* | 6/2015 | Lee | ...................... | H03M 1/1295 250/208.1 |
| 2015/0181145 A1* | 6/2015 | Lee | ........................ | H04N 5/378 250/208.1 |
| 2016/0165166 A1* | 6/2016 | Koh | ..................... | H04N 5/3575 348/302 |

* cited by examiner

ANALOG-TO-DIGITAL CONVERTER CONFIGURED TO OPERATE AT HIGH SPEED AND IMAGE SENSOR INCLUDING THE SAME

CROSS-REFERENCE TO RELATED APPLICATION

This application claims priority under 35 U.S.C. §119 to Korean Patent Application No. 10-2013-0162838 filed on Dec. 24, 2013, the disclosure of which is hereby incorporated by reference in its entirety.

BACKGROUND

1. Field

Example embodiments provide an image sensor and a method of controlling the same. In at least some example embodiments, the image sensor is capable of operating at a relatively high speed.

2. Description of Related Art

An image sensor refers to a semiconductor device configured to convert an optical image into an electric signal using a semiconductor that is responsive to light. In general, image sensors may be classified into charge-coupled devices (CCDs) and complementary metal-oxide-semiconductor (CMOS) image sensors (CISs).

The image sensor may include a pixel array having a matrix structure including a plurality of pixels that are selected by a plurality of columns and a plurality of rows, and a converter configured to convert an output of the pixel array. That is, when the pixel array senses an optical image and outputs an analog voltage, the converter may convert the sensed analog voltage into a digital value and subsequent process the digital value.

The process of converting the analog voltage output by the pixel array into the digital value may affect the accuracy and speed of the image sensor.

SUMMARY

Example embodiments of the inventive concepts provide an image sensor capable of elevating efficiency of an analog-to-digital converter (ADC) block.

In accordance with some example embodiments of the inventive concepts, an image sensor includes a pixel array including a plurality of pixels, and an ADC configured to compare a reference voltage with an analog voltage output by the pixel array, latch and decode a comparison result, the ADC being controlled by clock information and a counter clock that are obtained by expanding and encoding a master clock.

The ADC may include a comparison unit configured to compare the reference voltage with the analog voltage output by the pixel array and output a comparison result, a control signal generating block configured to generate the encoded clock information and the counter clock in response to the master clock, and a latch block configured to be controlled in response to the encoded clock information and the counter clock generated by the control signal generating block and latch the comparison result of the comparison unit.

The control signal generating block may include a first latch controller configured to expand the master clock, generate a multi-phase clock, and provide the encoded clock information as a latch control signal, and a second latch controller configured to provide a latch control signal that sequentially increases in response to the mask clock.

The first latch controller may include a delay locked loop (DLL) circuit configured to generate a multi-phase clock having a predetermined phase difference in response to the mask clock, a pulse generator configured to provide pulse signals corresponding to the generated multi-phase clock, and a pulse combination unit configured to combine the pulse signals.

The pulse combination unit may include any one of a gray code converter, an encoder, and a multiplexer.

The first latch controller may include a multi-phase phase locked loop (PLL) circuit configured to generate a multi-phase clock having a predetermined phase difference in response to the master clock, a pulse generator configured to provide pulse signals corresponding to the generated multi-phase clock, and a pulse combination unit configured to combine the pulse signals.

The second latch controller may include a gray counter.

In accordance with other example embodiments of the inventive concepts, an image sensor includes a pixel array including a plurality of pixels, a ramp voltage generator configured to generate a ramp voltage to be compared with an analog voltage output by the pixel array, and an ADC configured to respond to a master clock and latch a result of comparison between the ramp voltage and the analog voltage output by the pixel array in response to a code signal independent of a counter and a counter clock generated using the counter.

The ADC may include a comparison unit configured to compare the ramp voltage with the analog voltage output by the pixel array and output a comparison result, a control signal generating block configured to generate a code signal independent of the counter and the counter clock, and a latch block configured to be controlled by the code signal independent of the counter and the counter block, which are generated by the control signal generating block, and latch a comparison result of the comparison unit.

The control signal generating block may include a first latch controller configured to expand the master clock, generate a multi-phase clock, and provide a code signal independent of the counter, as a latch control signal, and a second latch controller configured to provide the counter clock serving as a latch control signal sequentially increasing in response to the master clock.

The first latch controller may include a multi-phase clock generating circuit configured to generate a multi-phase clock having a predetermined phase difference in response to the master clock, a pulse generator configured to provide pulse signals corresponding to the generated multi-phase clock, and a pulse combination unit configured to combine the pulse signals.

The multi-phase clock generating circuit may include any one of a DLL circuit and a multi-phase PLL circuit.

The pulse combination unit may include any one of a gray code converter, an encoder, and a multiplexer.

The second latch controller may include a gray counter.

At least some example embodiments are related to an analog-to-digital converter (ADC) configured to convert an analog pixel signal from a pixel array to a digital signal.

In some example embodiments, the ADC includes a control signal generator configured to generate a plurality of encoded pulse signals based on an external master clock signal such that the plurality of encoded pulse signals have an increased number of phases and fewer bits than the external master clock signal; comparators configured to generate a comparison signal indicating which of a reference voltage and a voltage of the analog pixel signal is larger; and latches configured to store the comparison signal in response to the plurality of encoded pulse signals.

In some example embodiments, the external master clock signal is a phase-locked loop clock signal and the control signal generator is configured to generate the plurality of encoded pulse signals without using a column counter in columns of the pixel array.

In some example embodiments, the control signal generator includes, a first latch controller configured to generate a first gray code by combining the plurality of encoded pulse signals; and a second latch controller configured to generate a second gray code that sequentially increases based on pulses of the external master clock signal.

In some example embodiments, the latches include, first latches configured to store least significant bits (LSBs) of the comparison signal in response to the first gray code; and second latches configured to store most significant bits (MSBs) of the comparison signal in response to the second gray code.

In some example embodiments, the ADC further includes decoders configured to decode the first gray code and add the decoded first gray code to the second gray code after the comparators have compared the reference voltage and the voltage of the analog pixel signal.

BRIEF DESCRIPTION OF THE DRAWINGS

The foregoing and other features and advantages of example embodiments of the inventive concepts will be apparent from the more particular description of some example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EXAMPLE EMBODIMENTS

Figure 1:
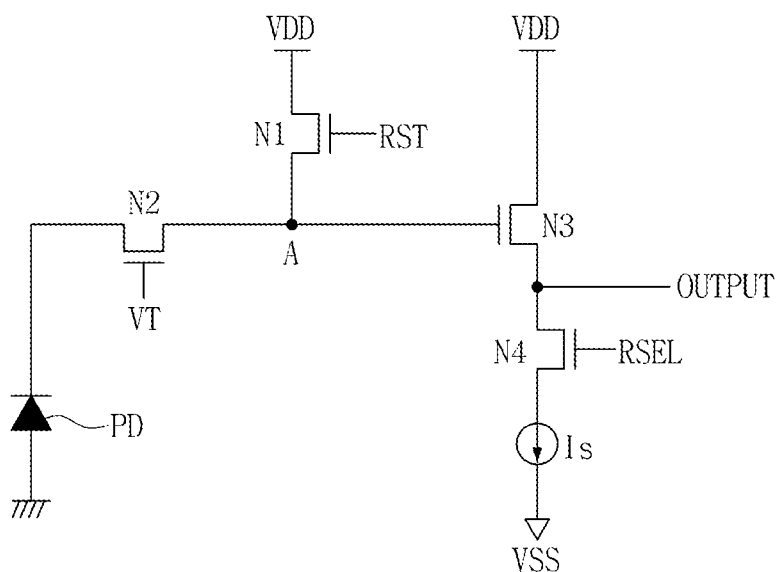
FIG. 1 is a circuit diagram of a unit pixel of a typical image sensor.

Example embodiments of the inventive concepts will now be described more fully with reference to the accompanying drawings, in which some example embodiments of the inventive concepts are shown, so that the disclosure can be easily implemented by one skilled in the art. Descriptions of well-known components and processing techniques are omitted so as not to unnecessarily obscure a gist of the inventive concept. It should be noted that the same components are denoted by the same or similar numbers even if the components are mentioned or described in different drawings.

While some example embodiments of the inventive concepts are disclosed herein, their specific structural and functional details are merely examples taken for descriptive purposes only. The inventive concepts may be embodied in many alternate forms and should not be construed as limited to the example embodiments set forth herein.

Accordingly, while example embodiments of the inventive concepts are susceptible to various modifications and may take various alternative forms, specific embodiments thereof are shown by way of example in the drawings and will herein be described in detail. It should be understood, however, that there is no intent to limit the example embodiments of the inventive concepts to the particular forms disclosed. On the contrary, example embodiments of the inventive concepts are to cover all modifications, equivalents, and alternatives falling within the spirit and scope of the claims.

It will be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of the inventive concept.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Meanwhile, spatially relative terms, such as "between" and "directly between," "adjacent to" and "directly adjacent to," and the like, which are used herein for ease of description to describe one element or feature's relationship to another element(s) or feature(s) as illustrated in the figures, should be interpreted similarly.

The terminology used herein is for the purpose of describing particular example embodiments only and is not intended to be limiting of the example embodiments of inventive concepts. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Example embodiments of the inventive concepts will now be described more fully with reference to the accompanying drawings, in which some example embodiments of the inventive concepts are shown.

FIG. 1 is a circuit diagram of a unit pixel constituting a pixel array (not shown) of a typical image sensor. The unit pixel may include a photoelectric converter, for example, a photodiode (PD).

Referring to FIG. 1, the unit pixel may include the photodiode PD and four transistors N1, N2, N3, and N4.

The PD may serve as a photoelectric converter to perform a photoelectric conversion operation to convert incident light into electrons in number corresponding to light intensity.

A transmission transistor N2 may be electrically connected between the PD and an output node A, which is a floating diffusion region. When a driving signal VT is applied to the transmission transistor N2, the transmission transistor N2 may be turned on and transmit electrons, generated by the PD through photoelectric conversion to the output node A.

A reset transistor N1 may be electrically connected between a power supply VDD and the output node A. The reset transistor N1 may be controlled in response to a reset signal RST and reset an electric potential of the output node A to a level of the power supply VDD.

An amplification transistor N3 may be electrically connected to the output node A and form a source follower along with a selection transistor N4 to be described below.

The selection transistor N4 may be controlled in response to a selection signal RESL and electrically connected between a current source IS and the amplification transistor N3. When the selection signal RESL is activated, the selection transistor N4 may be turned on so that an electric potential of the output node A can be amplified via the amplification transistor N3 and output via a OUTPUT node between the amplification transistor N3 and the selection transistor N4.

In the above-described manner, an analog voltage output by each pixel of the pixel array (not shown) may be converted into a digital value and subsequently processed. High-speed image sensors may require this analog-to-digital conversion ADC to be performed at high speeds.

Figure 2:
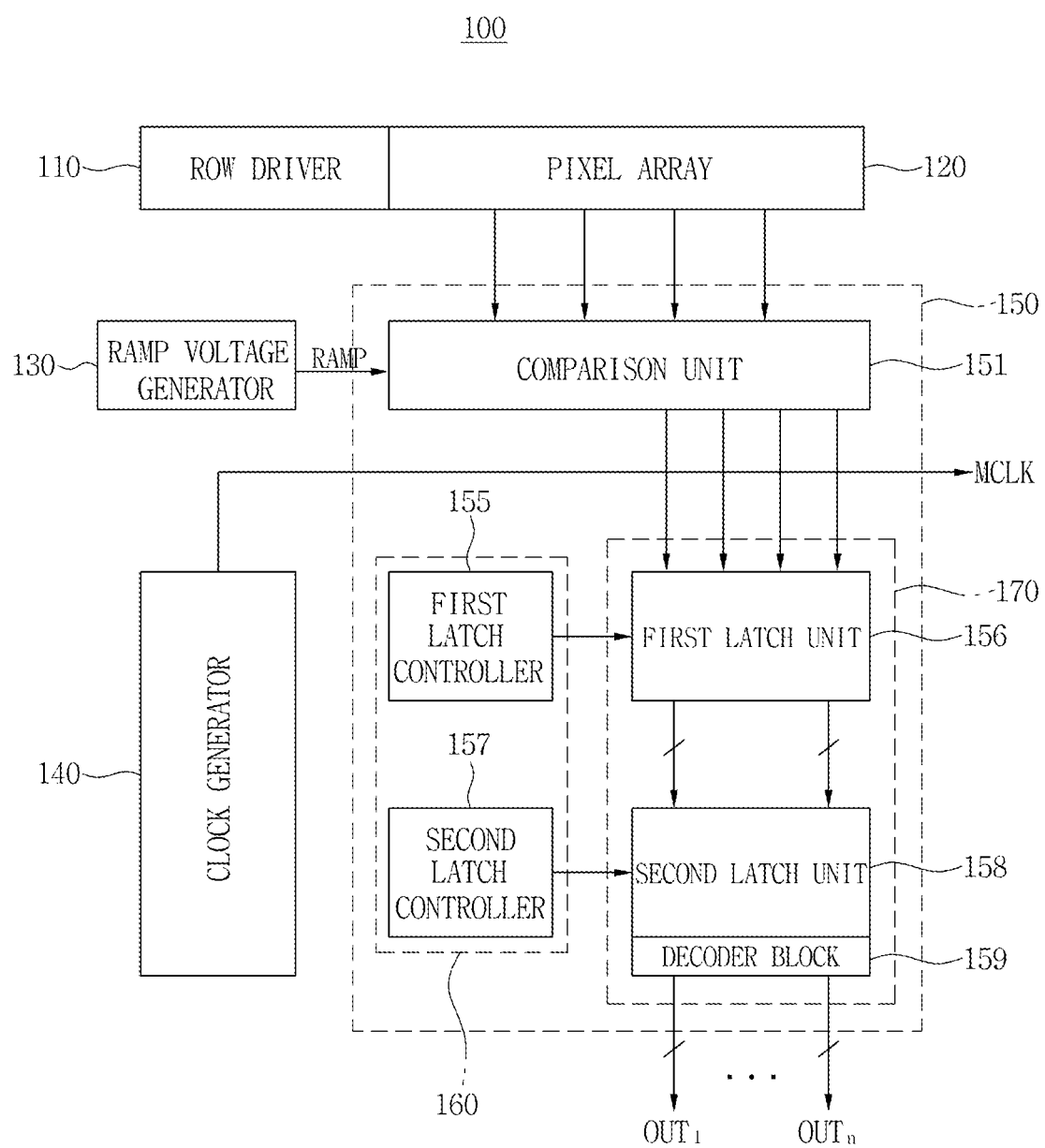
FIG. 2 is a block diagram of an image sensor according to some example embodiments of the inventive concepts.

FIG. 2 is a schematic block diagram of an image sensor 100 according to some example embodiments of the inventive concepts.

Referring to FIG. 2, the image sensor 100 may include a row driver 110, a pixel array 120, a ramp voltage generator 130, a clock generator 140, and an ADC 150. The ADC 150 may include a comparison unit 151, a control signal generating block 160, and a latch block 170.

The row driver 110 may select a row of the pixel array 1120 via a row control signal generated by decoding an address signal input thereto.

The pixel array 120 may include pixels arranged in a matrix shape and connected to a plurality of rows and a plurality of columns. Each of the pixels may include a red pixel configured to convert light in a red spectrum range into an electric signal, a green pixel configured to convert light in a green spectrum range into an electric signal, and a blue pixel configured to convert light in a blue spectrum range into an electric signal, however, example embodiments are not limited thereto. Color filters (not shown) configured to transmit light in specific spectrum ranges may be respectively arranged on the pixels. An analog voltage sensed by the selected row of the pixel array 120 may be provided to the ADC 150.

The ramp voltage generator 130 may generate a reference voltage ramp voltage RAMP and provide the reference voltage ramp voltage RAMP to the ADC 150. For example, the ramp voltage generator 130 may include an integrator and generate a ramp voltage RAMP a level of which varies in a slantwise waveform or a step waveform.

According to some example embodiments of the inventive concepts, the clock generator 140 may include a phase-locked loop (PLL) circuit. The PLL circuit may generate an output signal whose phase is related to the phase of an input signal. For example, the clock generator 140 may provide a PLL clock, which operates at a high speed, as a master clock MCLK. The clock generator 140 may convert an externally input clock into a high-speed clock having a higher frequency than the external clock.

The comparison unit 151 of the ADC 150 may compare the ramp voltage RAMP with the analog voltage generated by the pixel array 120 and provide a comparison result to the latch block 170.

Operations of the control signal generating block 160 and the latch block 170 will now be described below.

The control signal generating block 160 may include a first latch controller 155 and a second latch controller 157. The latch block 170 may include a first latch unit 156, a second latch unit 158, and a decoder block 159.

The first latch controller 155 may expand a master clock MCLK, generate a multi-phase clock, convert the multi-phase clock into a gray code serving as a latch control signal, and control the first latch unit 156 of the latch block 170.

The second latch controller 157 may include a gray counter G configured to generate a gray code serving as a latch control signal, and control the second latch unit 158 based on the latch control signal.

The decoder block 159 may decode values latched in the first and second latch units 156 and 158, convert the decoded values into binary codes, and output the binary codes.

Figure 3:
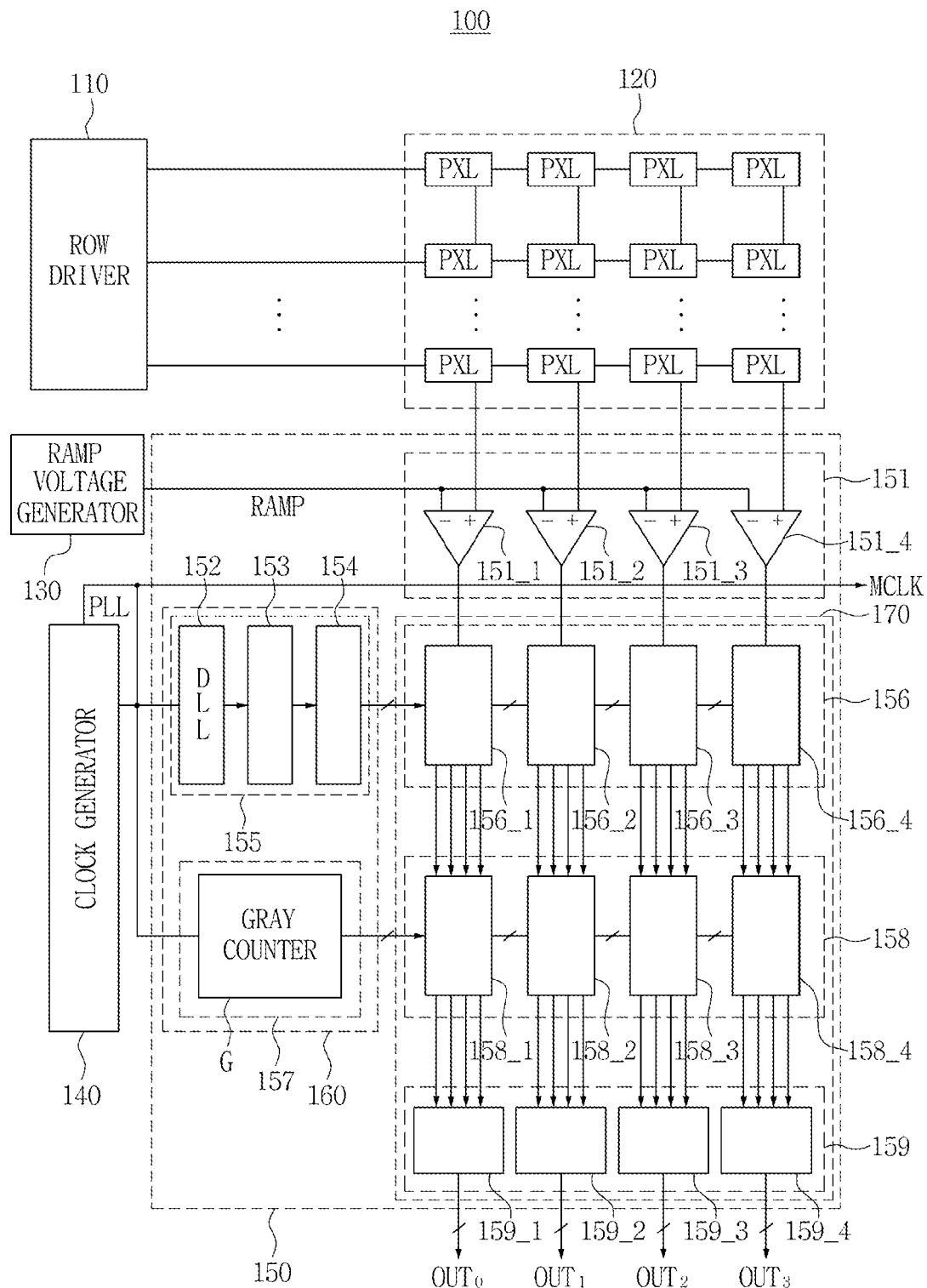
FIG. 3 is a detailed block diagram of the image sensor shown in FIG. 2.

FIG. 3 is a detailed block diagram of the image sensor shown in FIG. 2.

Referring to FIG. 3, some features of the image sensor 100 will now be described in further detail.

Referring to FIG. 3, the pixel array 120 may include a plurality of pixels PXL arranged in a matrix shape. Although a structure in which each group of four pixels is clustered is shown in FIG. 3 for brevity, example embodiments of the inventive concepts are not limited thereto. When the pixel array 120 includes unit pixels PXL 2-dimensionally arranged in m rows and n columns, a row signal line may be disposed in each of the m rows, and a column signal line may be disposed in each of the n columns.

The comparison unit 151 may include a plurality of comparators 151-1, 151-2, 151-3, and 151-4 corresponding to each column of a desired (or, alternatively a predetermined) unit (i.e., cluster) of a selected row.

A row control signal (not shown) output by the row driver 110 may be output and transmitted to each row of pixels of the pixel array 120 to activate any one of a plurality of rows. When an analog voltage sensed by each of pixels in a selected row is output to the row signal line, the analog voltage may be compared with a ramp voltage RAMP by the corresponding one of the comparators 151-1, 151-2, 151-3, and 151-4 of the comparison unit 151.

A reference signal ramp voltage RAMP may be applied to a first terminal "−" of each of the comparators 151-1, 151-2, 151-3, and 151-4, and an analog voltage sensed by a pixel may be applied to a second terminal "+" thereof. The comparators 151-1 to 151-4 may compare an analog voltage corresponding to an image signal that varies according to the amount of external incident light and a ramp voltage RAMP having a desired (or, alternatively, a predetermined slope) and generate an output based on the comparison. For example, the output of the comparators 151-1, 151-2, 151-3, and 151-4 may a low level when the ramp voltage RAMP is higher than the analog voltage applied to a respective one of the second terminals "+", and a high level when the ramp voltage RAMP is less than or equal to the analog voltage applied to the respective second terminal "+". Also, the latch block 170 may latch values at a time point in which the output of the comparators 151-1, 151-2, 151-3, and 151-4 are inverted. Here, the output of the respective comparators 151-1, 151-2, 151-3, and 151-4 may be values of time taken to perform a comparison operation. The time values may be counted by a subsequent counter and output as digital values.

As described above, the clock generator 140 may provide a PLL clock as a master clock MCLK. Although the clock generator 140 performs clocking operations at a higher speed than when a typical external clock is used, the clocking operations may be limited due to fabrication processes. Further, when clocks are buffered in the latch block 170, relatively high power consumption may result due to the properties of a PLL circuit.

Accordingly, in some example embodiments a PLL clock is divided to expand and use information, thus, reducing the number of latches. In other words, a single clock signal may be received and expanded into a multi-phase clock signal having a plurality of pieces of information and used to increase clocking efficiency. Also, the clock signal may be encoded to facilitate the control of the multi-phase clock signal, thereby reducing power consumption.

The first latch controller 155 according to some example embodiments may include a delay locked loop (DLL) circuit 152, a pulse generator 153, and a pulse combination unit 154.

The first latch controller 155 may control transmission of an output of the comparison unit 151 to the first latch unit 156. The first latch controller 155 may control a least significant bit (LSB) out of bits output by the comparison unit 151.

The DLL circuit 152 may be implemented by any circuit capable of converting a single clock signal into a plurality of clock signals. In some example embodiments of the inventive concepts, the DLL circuit 152 may receive a phase-locked loop (PLL) clock as a master clock MCLK and provide the PLL clock as a delay-locked loop (DLL) clock.

The pulse generator 153 may receive a plurality of phase clock signals from the DLL circuit 152 and generate pulse signals. Operations of the pulse generator 153 will be described in detail later with reference to the following drawings.

The pulse combination unit 154 may combine pulse signals generated by the pulse generator 153 and encode the pulse signals. For example, when the pulse generator 153 generates 16 pulse signals in response to a 16-phase DLL clock signal, the pulse combination unit 154 may encode the 16 pulse signals and generate a 4-bit signal as shown in Equation 1:

$$2^n = M \qquad \text{Equation (1)}$$

wherein n is a bit number, and M is the number of cases (or the number of pieces of information).

Using Equation 1, the pulse combination unit 154 may convert a plurality of pulse signals into a 4-bit code signal. The 4-bit code signal may contain clock information regarding the order of generation of a clock signal.

The pulse combination unit 154 may include a decoder configured to convert a plurality of input signals into a desired (or, alternatively, a predetermined) bit signal. Alternatively, the pulse combination unit 154 may include a gray code converter capable of sustaining internal operations using gray codes so that the pulse combination unit 154 can be compatible with a conventional design structure. Accordingly, input signals may not necessarily be converted into gray codes. In some cases, the pulse combination unit 154 may include an encoder or multiplexer configured to receive m pieces of information and output n pieces of information.

Using the aforementioned configuration, the first latch controller 155 according to some example embodiments of the inventive concepts may convert a PLL clock serving as a master clock MCLK into a DLL clock capable of operating at relatively higher speed without buffering limitation and convert the DLL clock into a gray code to enable internal operations.

Accordingly, in some example embodiments of the inventive concepts, a PLL clock serving as a master clock MCLK may be encoded to reduce power consumption. That is, to use phases of a DLL clock as counter clocks, the master clock MCLK may be converted into a clock having more phases and encoded in an equal number to the number of the phases, and latch units (not shown) corresponding to respective codes may be provided to reduce power consumption. For example, 4 bits corresponding to a 16-phase clock may be generated, and without using a column counter.

Although a DLL clock itself may be used as clock information, latch units configured to store information regarding each phase may be required in an equal number to the number of the generated phases. Accordingly, when 16 multi-phase clocks are generated, 16 latch units may be required.

However, in some example embodiments of the inventive concepts, since only four latch units are used to store encoded clock information, power consumption may be reduced. Here, each of the latch units may be an SR latch configured to encode variously expanded clocks and generate and store bits.

As described above, in some example embodiments of the inventive concepts, even if an additional column counter corresponding to a column is not provided, generated clocks may be expanded into a multi-phase clock, and output values of comparators 151-1, 151-2, 151-3, and 151-4 may be latched at a high speed in response to a plurality of pieces of clock information (4-bit codes).

The second latch controller 157 may include a gray counter G. The second latch controller 157 may generate gray codes that sequentially increase based on clocks. Here, the second latch controller 157 may generate gray codes that sequentially increase in response to master clocks MCLK. The second latch controller 157 may control a most significant bit (MSB) out of bits output.

The first latch unit 156 may include a plurality of latch units 156-1, 156-2, 156-3, and 156-4. Each of the latch units 156-1, 156-2, 156-3, and 156-4 may latch an output value of a corresponding one of the comparators 151-1, 151-2, 151-3, and 151-4 in response to a gray code generated by the first latch controller 155.

The second latch unit 158 may include a plurality of latch units 158-1, 158-2, 158-3, and 158-4.

Each of the latch units 158-1, 158-2, 158-3, and 158-4 may latch an output value of the corresponding one of the comparators 151-1, 151-2, 151-3, and 151-4 in response to a gray code generated by the second latch controller 157.

A LSB, which is an output bit of the first latch unit 156, may have a different bit number from an MSB, which is an output bit of the second latch unit 158.

The decoding block 159 may include a plurality of decoders 159-1, 159-2, 159-3, and 159-4.

The plurality of decoders 159-1, 159-2, 159-3, and 159-4 may convert values latched in the first and second latch units 156 and 158 into binary codes and output the binary codes. The outputs OUT0 to OUT3 of LSBs and MSBs may be output through the corresponding decoders 159-1, 159-2, 159-3, and 159-4.

The analog to digital converter 150 may convert an optical image captured by the image sensor 100 to a digital image using the encoded pulse signals and provide the digital image to, for example, a display device.

Figure 4:
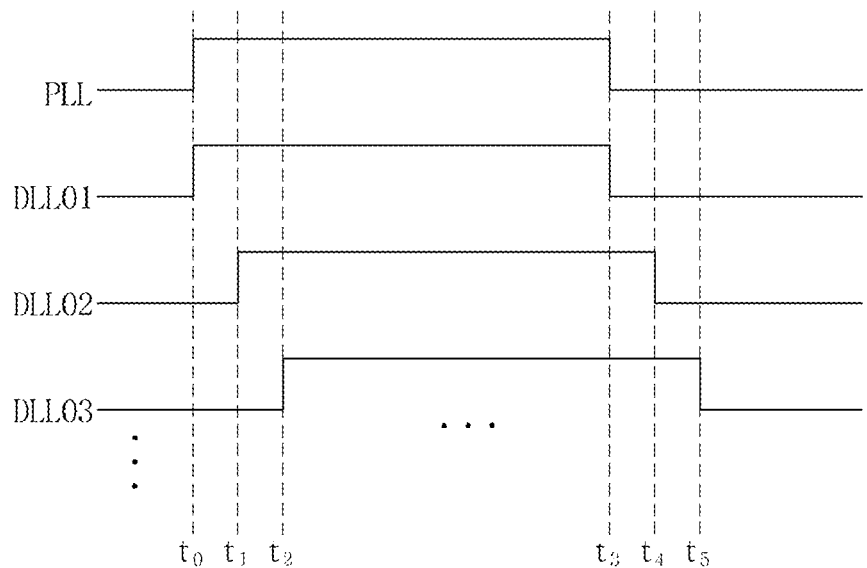
FIG. 4 is a conceptual timing diagram of an operation of converting a master clock shown in FIG. 3 into a delay locked loop (DLL) clock.

FIG. 4 is a conceptual timing diagram of an operation of converting a master clock MCLK shown in FIG. 3 into a DLL clock.

Referring to FIGS. 3 and 4, when a PLL clock is applied as a master clock MCLK, the DLL circuit 152 may expand the PLL clock into a multi-phase clock having a desired (or, alternatively, a predetermined) phase difference.

Although a 16-division DLL clock is shown as an example, example embodiments of the inventive concepts are not limited thereto.

A clock DLL01 in synchronization with a rising edge of the PLL clock may be generated at a time point t0.

To maintain the desired phase difference, a clock DLL02, which is delayed for a desired (or, alternatively, a predetermined) time with respect to the clock DLL01, may be generated at a time point t1.

Subsequently, after a desired (or, alternatively, a predetermined) time has elapsed, a clock DLL03, which is delayed for a desired (or, alternatively, a predetermined) time with respect to the clock DLL02, may be generated at a time point t2. Afterwards, although not shown in the drawings, a multi-phase clock having 16 phase differences may be generated in the above-described manner.

Referring to the time points t3 and t4, as illustrated in FIG. 4, after the clock DLL02 is delayed for a desired (or, alternatively, a predetermined) time with respect to the PLL clock, the clock DLL02 falls. Similarly, referring to the time point t5, the clock DLL03 is delayed by a desired (or, alternatively, a predetermined) phase difference with respect to the clock DLL02, the clock DLL03 falls.

Figure 5:
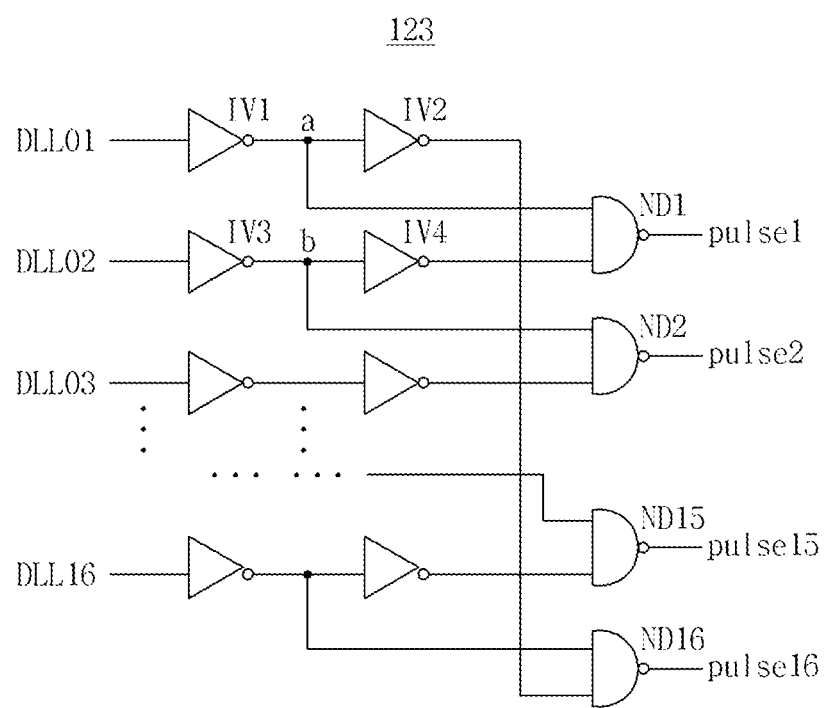
FIG. 5 is a circuit diagram of a pulse generator shown in FIG. 3.
Figure 6:
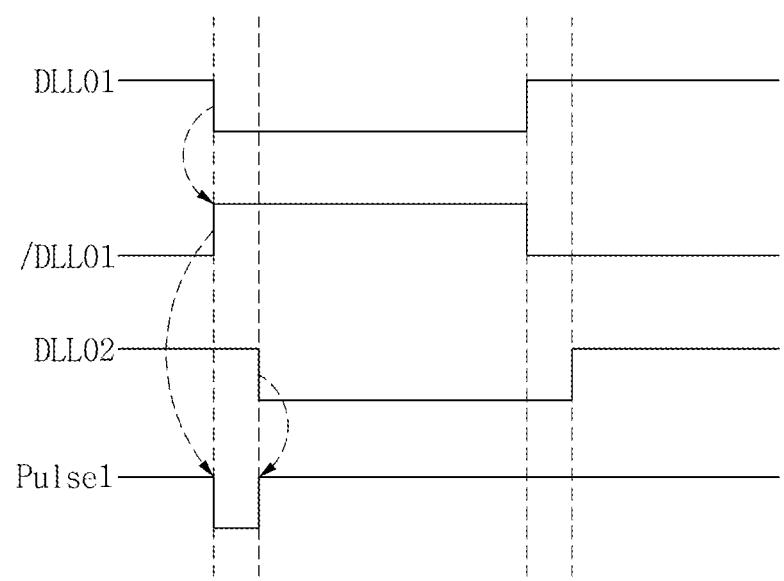
FIG. 6 is a timing diagram of a process of generating a first pulse using the pulse generator shown in FIG. 5.

FIG. 5 is a circuit diagram of the pulse generator 153 shown in FIG. 3. FIG. 6 is a timing diagram of a process of generating a first pulse pulse1 using the pulse generator 153 shown in FIG. 5.

Referring to FIGS. 5 and 6, the pulse generator 153 may receive a plurality of phase clock signals from the DLL circuit 152 and generate pulse signals.

The pulse generator 153 may include a plurality of inverters IV1, IV2, IV3, IV4 . . . and a plurality of NAND gates ND1, ND2 . . . .

A first inverter IV1 may receive the delay locked loop (DLL) clock DLL01 and transmit the DLL clock DLL01 to a node "a". A second inverter IV2 may receive a signal of the node "a" and provide the signal to a sixteenth NAND gate ND16.

A third inverter IV3 may receive a DLL clock DLL02 and provide the DLL clock DLL02 to a node "b". A fourth inverter IV4 may receive a signal of the node "b" and provide the signal to a second NAND gate ND2.

The output of the inverters may be provided to NAND gates to generate the pulses. For the sake of brevity, generation of the first pulse pulse1 in response to the DLL clock DLL01 will be described below.

A first NAND gate ND1 may perform a logical NAND on an inverted clock of the DLL01 clock and the DLL02 clock.

Referring to FIGS. 5 and 6, the first pulse pulse1 may be a pulse signal that falls in response to a rising edge of an inverted clock DLL01 and rises in response to a falling edge of the clock DLL02. This may result from an operation of a NAND gate configured to output a low-level signal when all received signals are at a high level.

Accordingly, it can be seen that the first pulse pulse1 corresponding to the clock DLL01 may be generated.

Likewise, pulse signals pulse2 to pulse 15 corresponding to the received phase clock may be similarly generated in response to DLL clocks DLL02 to DLL15.

Table 1 shows results of the pulse combination unit 154 described with reference to FIG. 3. That is, Table 1 shows decimal numbers indicated by binary codes and the binary codes indicated by gray codes.

As described above, the pulse combination unit 154 may convert a plurality of pulse signals into an n-bit code signal. As discussed above, the pulse combination unit 154 may include a gray code converter, however, example embodiments of the inventive concepts are not limited thereto, and the pulse combination unit 154 may be any circuit capable of indicating a received pulse signal as a binary signal.

A gray code refers to a code in which a level of only one bit varies between a logic "0" and a logic "1". The gray code may be a code obtained by performing a logic Exclusive OR (XOR) operation on bits proximate to a binary code. When sequential values are expressed, two proximate values may be different in only one bit. Thus, the gray code may be used to express sequential analog data. Also, the gray code may be used to express numbers in an I/O device or an ADC because only one bit needs to be changed and few hardware errors occur. However, example embodiments of the inventive concepts are not limited thereto.

TABLE 1

| Decimal number | Binary code | Gray code |
|---|---|---|
| 0 | 0000 | 0000 |
| 1 | 0001 | 0001 |
| 2 | 0010 | 0011 |
| 3 | 0011 | 0010 |
| 4 | 0100 | 0110 |
| 5 | 0101 | 0111 |
| 6 | 0110 | 0101 |
| 7 | 0111 | 0100 |
| 8 | 1000 | 1100 |
| 9 | 1001 | 1101 |

As in Table 1, the corresponding pulse signals may be combined and indicated as a gray code. In some example embodiments of the inventive concepts, 16 DLL phase clocks may be converted into a 4-bit gray code. As described above, pulse signals may be combined and stored in an SR latch unit (not shown) before the pulse signals are converted into a gray code, and thus four SR latch units (not shown) may be utilized to convert the pulse signals into a 4-bit gray code.

However, as described above, the conversion of the pulse signals into the 4-bit gray code is only an example, and example embodiments of the inventive concepts are not limited thereto. For example, the pulse signals may be converted into a binary code instead of the gray code.

Referring to FIGS. 2 to 6, operations of the image sensor according to some of the example embodiments of the inventive concepts will now be described.

Clock information may be generated as code information, like counter clocks, without an additional column counter. That is, to generate clocks operating at a high speed, a master clock MCLK may be expanded into a multi-phase clock to generate pulse signals, and the generated pulse signals may be combined to generate bit code information. In this case, the pulse combination unit 154 may include a latch unit (not shown) to store clock information obtained at a comparison time point, in a logic state of a clock.

An analog voltage sensed by each of pixels in a selected row may be compared with a ramp voltage RAMP via each of comparators 151-1, 151-2, 151-3, and 151-4 of a comparison unit 151. The comparison operation may include latching a comparison result value in a first latch unit 156 of a latch block 170 in response to a desired (or, alternatively, a predetermined) clock (i.e., a multi-phase clock). Also, the comparison result value of each of the comparators 151-1, 151-2, 151-3, and 151-4 may be latched in a second latch unit 158 according to a gray code of a second latch controller 157. Respective values latched in the above-described latch block 170 may be transmitted as LSBs and MSBs to a plurality of decoders 159-1, 159-2, 159-3, and 159-4, and may be output as binary bits (or binary codes) via the decoders 159-1, 159-2, 159-3, and 159-4. For example, data latched in the first latch unit 156 may be decoded and added as a less significant bit to a count value obtained by a gray counter G serving as a global counter. According to some example embodiments of the inventive concepts, a logic state of a multi-phase clock signal obtained when a comparison between a ramp voltage RAMP serving as a reference voltage and a pixel signal is ended, may be latched, decoded, and added as a less significant bit to the count value obtained by the global counter G.

Conventionally, when a selected row is accessed, a column counter may be used for each column of the corresponding row. However, in some example embodiments of the inventive concepts, a generated DLL clock may be encoded and used as clock information so that circuit configuration can be simplified and power consumption can be reduced. Accordingly, in some of the example embodiments of the inventive concepts, a clock may be generated without disposing an additional column counter in each column. Thus, only one gray counter may be used that serves as a global counter per unit (e.g., a cluster), thereby facilitating the control of operations and simplifying circuits. Furthermore, since a single gray counter may be unable to control all bits, the overload of the global counter may be prevented by the encoding.

Figure 7:
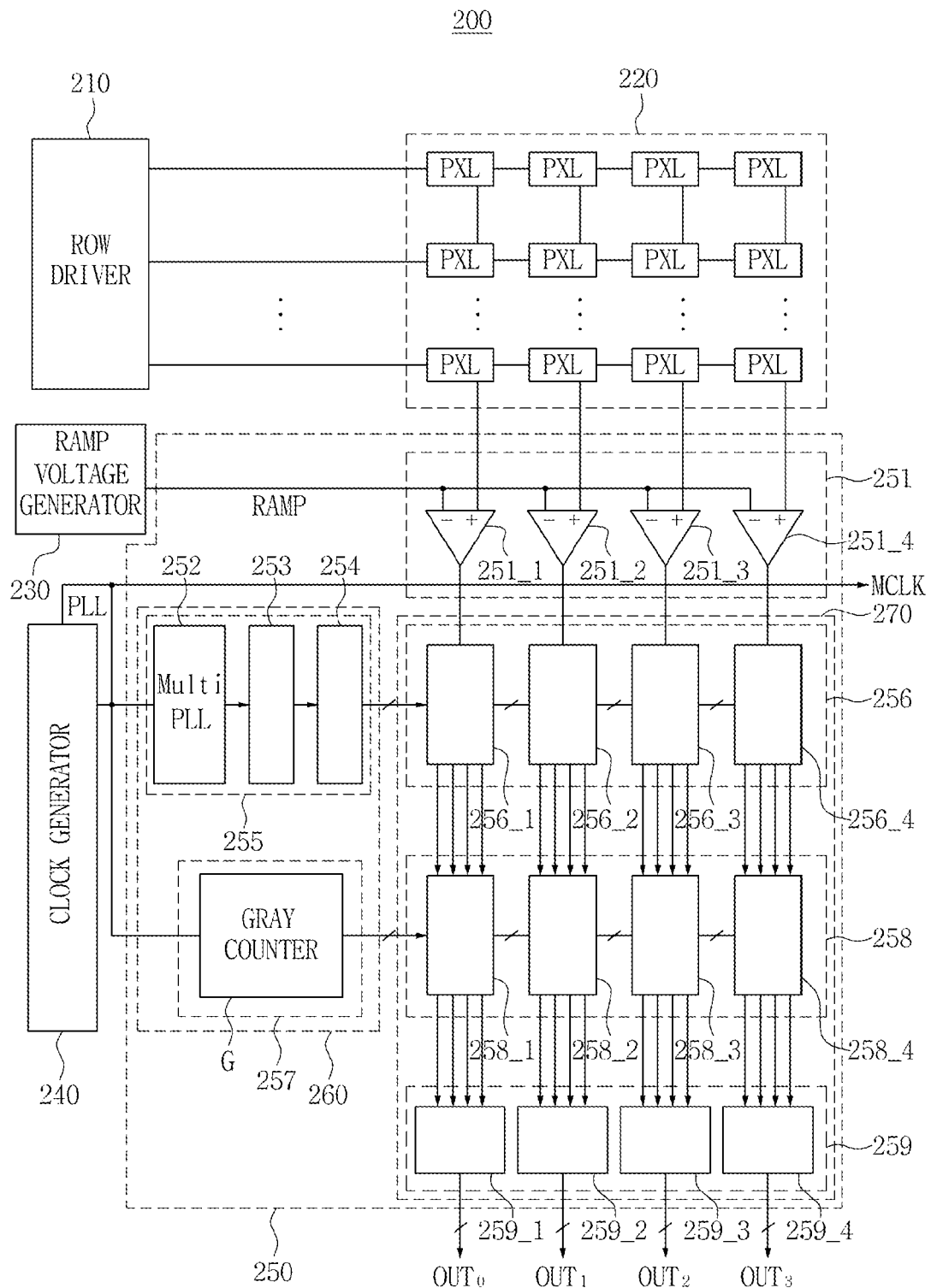
FIG. 7 is a block diagram of an image sensor according to other example embodiments of the inventive concepts.

FIG. 7 is a block diagram of an image sensor 200 according to other example embodiments of the inventive concepts. Referring to FIG. 7, a description of similar components to those shown in FIG. 3 will briefly presented with reference to FIG. 7, and only differences therebetween will be described in detail.

A pixel array 220 may include a plurality of pixels PXL arranged in a matrix shape.

A comparison unit 251 may include a plurality of comparators 251-1, 251-2, 251-3, and 251-4.

When an analog voltage sensed by each of pixels in a selected row is output, the analog voltage may be compared with a ramp voltage RAMP via each of the comparators 251-1, 251-2, 251-3, and 251-4 of the comparison unit 251. That is, a ramp voltage RAMP for a reference signal may be applied to a first terminal "−" of each of the comparators 251-1, 251-2, 251-3, and 251-4, and an analog voltage sensed by each of the pixels may be applied to a second terminal "+" thereof. Thus, an output of each of the comparators 251-1, 251-2, 251-3, and 251-4 may have a low level when the ramp voltage RAMP is higher than the analog voltage applied to the second terminal "+", and have a high level when the ramp voltage RAMP is less than or equal to the analog voltage applied to the second terminal "+".

A clock generator 240 according to some example embodiments of the inventive concepts may provide an external clock as a master MCLK. A first latch controller 255 may include a multi-PLL circuit 252, a pulse generator 253, and a pulse combination unit 254.

In some example embodiments, as illustrated in FIG. 7, a multi-phase PLL clock may be included in the first latch controller 255. A multi-phase clock signal having a plurality of pieces of information corresponding to one clock signal may be used to increase clocking efficiency. Thus, the multi-phase clock may be encoded to facilitate the control of the multi-phase clock, thereby reducing power consumption. A multi-phase PLL circuit is a circuit configured to divide a PLL clock into a plurality of phases and generate a multi-phase clock signal as described in U.S. Pat. No. 5,132,633.

The first latch controller 255 may control an LSB out of bits output by the comparison unit 251.

The pulse generator 253 may receive a plurality of phase clock signals from the multi-PLL circuit 252 and generate pulses.

The pulse combination unit 254 may combine the pulse signals generated by the pulse generator 253 and encode the pulse signals. For example, the pulse combination unit 254 may generate 16 pulse signals corresponding to a 16-phase DLL clock signal, encode the 16 pulse signals, and generate 4-bit signals.

In some example embodiments of the inventive concepts, a master clock MCLK may be expanded into a multi-phase clock signal to generate pulse signals, and the generated pulse signals may be combined to generate bit code information so that a clock (e.g., a counter clock) operating at a high speed can be generated without an additional column counter. The pulse combination unit 254 may include a latch unit (not shown) to store clock information obtained at a comparison time point, in a logic state of a clock.

An analog voltage sensed by each pixel of a selected row may be compared with a ramp voltage RAMP by the corresponding one of comparators 251-1, 251-2, 251-3, and 251-4 of the comparison unit 251. The comparison process may include latching a comparison result value as an LSB in a first latch unit 256 of a latch block 270 according to a multi-phase clock. Also, a comparison result of each of the comparators 251-1, 251-2, 251-3, and 251-4 may be latched as a MSB in a second latch unit 258 in response to a gray code of a second latch controller 257.

The latch values latched in the above-described latch block 270 may be transmitted as LSBs and MSBs to a plurality of decoders 259-1, 259-2, 259-3, and 259-4, and the plurality of decoders 259-1, 259-2, 259-3, and 259-4 may output binary bits (or binary codes). Data latched in the first latch unit 256 may be decoded and added as a less significant bit LSB to data latched in the second latch unit 258 (i.e., a count value counted by a gray counter G, which is a global counter). According to some example embodiments of the inventive concepts, a logic state of a multi-phase clock signal, which is generated when a comparison between the ramp voltage RAMP serving as a reference voltage and a pixel signal is ended, may be latched, decoded, and added as a less significant bit to a count value counted by the global counter G.

That is, a desired (or, alternatively, a predetermined) clock may be received and expanded into a multi-phase clock having a desired (or, alternatively, a predetermined) phase difference, and the multi-phase clock may be encoded to generate pulse signals. Thus, a clock operating like a counter clock may be generated without operations of a column counter. Accordingly, the image sensor may operate at a high speed and reduce power consumption.

Figure 8:
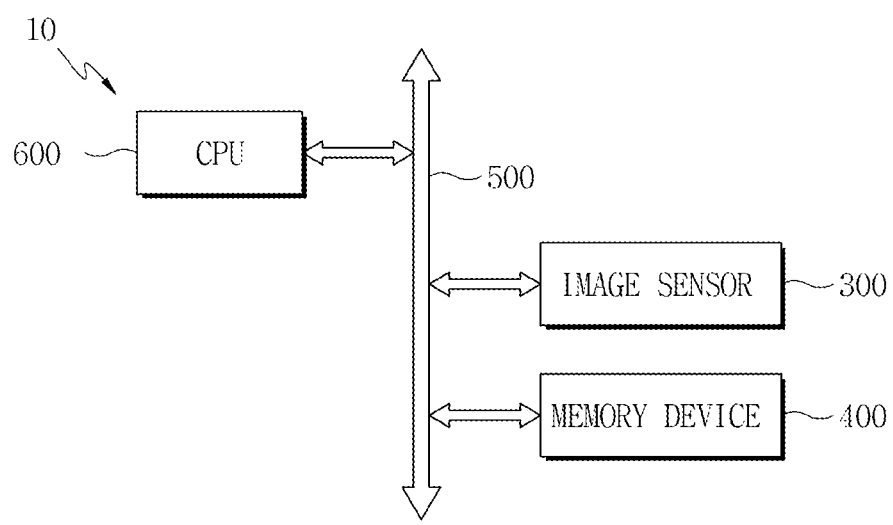
FIG. 8 is a schematic block diagram of a semiconductor system including an image sensor according to some example embodiments of the inventive concepts.

FIG. 8 is a schematic block diagram of a semiconductor system 10 including an image sensor 300 according to some example embodiments of the inventive concepts.

Referring to FIG. 8, the semiconductor system 10 may include the image sensor 300, a memory device 400, a bus 500, and a central processing unit (CPU) 600.

The semiconductor system 10 may include a computer system, a camera system, a scanner, a navigation system, a video phone, a supervision system, an automatic focus system, a tracing system, an operation monitoring system, and an image stabilization system.

The CPU 600 may transmit and receive data through the bus 500 and control operations of the image sensor 300.

The memory device 400 may receive an image signal output from the image sensor 300 through the bus 500 and store the image signal therein.

Although a schematic configuration of the semiconductor system 10 is shown as an example, the semiconductor system 10 may further include an TO interface capable of communicating with the outside or a digital signal processor (DSP).

Example embodiments of the inventive concepts can be applied to an image sensor, and particularly to, a CMOS image sensor and a memory system including the same.

The image sensor can generate a multi-phase clock and use the multi-phase clock as a counter clock to enable high-speed operations and reduce power consumption.

The control signal generator 160 may include a processor and a memory (not shown).

The processor may be an arithmetic logic unit, a digital signal processor, a microcomputer, a field programmable array, a programmable logic unit, a microprocessor or any other device capable of responding to and executing instructions in a defined manner such that the processor is programmed with instructions that configure the processing device as a special purpose computer to generate a plurality of encoded pulse signals based on an external master clock signal.

The instructions may be stored on a non-transitory computer readable medium. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The non-transitory computer-readable media may also be a distributed network, so that the program instructions are stored and executed in a distributed fashion. The program instructions may be executed by one or more processors.

The foregoing is illustrative of example embodiments and is not to be construed as limiting thereof. Although a few example embodiments have been described, those skilled in the art will readily appreciate that many modifications are possible without materially departing from the novel teachings and advantages. Accordingly, all such modifications are intended to be included within the scope of the example embodiments of the inventive concepts as defined in the claims. In the claims, means-plus-function clauses are intended to cover the structures described herein as performing the recited function, and not only structural equivalents but also equivalent structures.

What is claimed is:

1. An image sensor comprising:
   a pixel array including a plurality of pixels; and
   an analog-to-digital converter (ADC) configured to receive a master clock, the ADC including,
      comparators configured to generate comparison results by comparing a reference voltage with a respective one of a plurality of analog voltages output by the pixel array,
      latches configured to latch the comparison results in response to encoded clock information and a counter clock, and
      a control signal generator configured to generate the encoded clock information and the counter clock by expanding and encoding the master clock, the control signal generator including,
         a first latch controller configured to expand the master clock, generate a multi-phase clock, and provide the encoded clock information to at least one first latch of the latches as a first latch control signal, and
         a second latch controller configured to provide a second latch control signal to at least one second latch of the latches, the second latch control signal sequentially increasing in response to the master clock.

2. The image sensor of claim 1, wherein the first latch controller comprises:
   a delay locked loop (DLL) circuit configured to generate a multi-phase clock having a phase difference in response to the master clock;
   a pulse generator configured to generate pulse signals corresponding to the generated multi-phase clock; and
   a pulse combiner configured to combine the pulse signals to generate the first latch control signal.

3. The image sensor of claim 2, wherein the pulse combiner comprises:
   one of a gray code converter, an encoder, and a multiplexer.

4. The image sensor of claim 1, wherein the first latch controller comprises:
   a multi-phase phase locked loop (PLL) circuit configured to generate a multi-phase clock having a phase difference in response to the master clock;
   a pulse generator configured to generate pulse signals corresponding to the generated multi-phase clock; and
   a pulse combiner configured to combine the pulse signals to generate the first latch control signal.

5. The image sensor of claim 4, wherein the pulse combiner comprises:
   one of a gray code converter, an encoder, and a multiplexer.

6. The image sensor of claim 1, wherein the second latch controller comprises:

a gray counter configured to generate a gray code and provide the gray code to at least one of the latches as the second latch control signal.

7. An image sensor comprising:
a pixel array including a plurality of pixels configured to output an analog voltages;
a ramp voltage generator configured to generate a ramp voltage;
latches configured to latch in response to a code signal to store comparison results; and
an analog-to-digital converter (ADC) including,
  comparators configured to compare the ramp voltage with a respective one of the analog voltages and output the comparison results,
  a control signal generator configured to generate the code signal independent of a counter and a counter clock generated using the counter, the control signal generator including,
    a first latch controller configured to expand the master clock, generate a multi-phase clock, and provide the code signal to at least one first latch of the latches as a first latch control signal, and
    a second latch controller configured to provide the counter clock serving as a second latch control signal to at least one second latch of the latches, the second latch control signal sequentially increasing in response to the master clock.

8. The image sensor of claim 7, wherein the first latch controller comprises:
a multi-phase clock generating circuit configured to generate a multi-phase clock having a phase difference in response to the master clock;
a pulse generator configured to generate pulse signals corresponding to the generated multi-phase clock; and
a pulse combiner configured to combine the pulse signals to generate the first latch control signal.

9. The image sensor of claim 8, wherein the multi-phase clock generating circuit comprises:
one of a delay locked loop (DLL) circuit and a multi-phase phase locked loop (PLL) circuit.

10. The image sensor of claim 8, wherein the pulse combiner comprises:
one of a gray code converter, an encoder, and a multiplexer.

11. The image sensor of claim 7, wherein the second latch controller comprises:
a gray counter configured to generate a gray code and provide the gray code to at least one of the latches as the second latch control signal.

12. An analog-to-digital converter (ADC) configured to convert analog pixel signals from a pixel array to a digital signal, the ADC converter comprising:
a control signal generator configured to generate a plurality of encoded pulse signals based on an external master clock signal such that the plurality of encoded pulse signals have an increased number of phases and fewer bits than the external master clock signal, the control signal generator including,
  a first latch controller configured to generate a first gray code by combining the plurality of encoded pulse signals, and
  a second latch controller configured to generate a second gray code that sequentially increases based on pulses of the external master clock signal;
comparators configured to generate comparison signals each indicating which of a reference voltage and a voltage of a respective one of the analog pixel signals is larger; and
latches each configured to store a respective one of the comparison signals in response to one of the first gray code and the second gray code.

13. The ADC converter of claim 12, wherein the external master clock signal is a phase-locked loop clock signal and the control signal generator is configured to generate the plurality of encoded pulse signals without using a column counter in columns of the pixel array.

14. The ADC converter of claim 12, wherein the latches include,
first latches configured to store least significant bits (LSBs) of the comparison signals in response to the first gray code; and
second latches configured to store most significant bits (MSBs) of the comparison signals in response to the second gray code.

15. The ADC converter of claim 14, further comprising:
decoders configured to decode the comparison signals stored in at least the second latches.

* * * * *